United States Patent [19]
Browning, III et al.

[11] Patent Number: 5,363,328
[45] Date of Patent: Nov. 8, 1994

[54] HIGHLY STABLE ASYMMETRIC SRAM CELL

[75] Inventors: Clyde H. Browning, III; Michael L. Longwell, both of Austin, Tex.

[73] Assignee: Motorola Inc., Schaumburg, Ill.

[21] Appl. No.: 69,325

[22] Filed: Jun. 1, 1993

[51] Int. Cl.$^5$ .............................................. G11C 13/00
[52] U.S. Cl. .................... 365/154; 365/181; 365/189.07
[58] Field of Search ................ 365/154, 181, 189.07

[56] References Cited

U.S. PATENT DOCUMENTS

| | | | |
|---|---|---|---|
| 4,590,508 | 5/1986 | Hirakawa et al. | 357/41 |
| 4,879,690 | 11/1989 | Anami et al. | 365/201 |
| 5,020,029 | 5/1991 | Ichinose et al. | 365/154 |
| 5,134,581 | 7/1992 | Ishibashi et al. | 365/181 |
| 5,153,852 | 10/1992 | Terrell | 365/154 |
| 5,267,192 | 11/1992 | Nogami | 365/154 |

OTHER PUBLICATIONS

Kuriyama et al., "An Asymmetric Memory Cell using a C-TFT for ULSI SRAMS", 1992 Symposium on VLSI Technology Digest of Tech. Papers, pp. 38, 39.
Chappell et al., "Stability and SER Analysis of Static RAM Cells", IEEE Transactions on Electron Devices, ED-32, No. 2, Feb. 1985, pp. 463-470.

*Primary Examiner*—Eugene R. LaRoche
*Assistant Examiner*—F. Niranjan
*Attorney, Agent, or Firm*—Daniel D. Hill

[57] ABSTRACT

An asymmetric static random access memory cell (50 and 53) includes polysilicon load elements (55 and 56), N-channel pull-down transistors (57 and 58), and N-channel coupling transistors (59 and 60). One of the coupling transistors (59 and 81) has a channel width that is less than the channel width of the other coupling transistor (60 and 80). The asymmetric cells (50 and 53) are located close to power supply voltage terminal $V_{SS}$, while conventional symmetrical cells (51 and 52) are located apart from the power supply voltage terminal $V_{SS}$. The asymmetric cells (50 and 53) correct an imbalance in the ground path caused by a parasitic resistance (83 and 86) of a diffusion layer (94) that is used to couple the asymmetric cells (50 and 53) to ground potential. The asymmetric cell (50 and 53) improves cell stability without degrading performance or increasing cell area.

16 Claims, 5 Drawing Sheets

FIG.1 —PRIOR ART—

HIGHLY STABLE ASYMMETRIC SRAM CELL

FIELD OF THE INVENTION

This invention relates generally to integrated circuit memories and more particularly to a highly stable asymmetric static random access memory cell.

BACKGROUND OF THE INVENTION

Static random access memories (SRAMs) are generally used in applications requiring high speed, such as a cache memory in a data processing system. A SRAM is usually implemented as an array of memory cells organized in rows and columns. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue when designing a SRAM. The SRAM cell must be stable against transients, process variations, soft error, and power supply fluctuations which may cause the cell to inadvertently change logic states, yet still provide high speed and low power operation.

FIG. 1 illustrates in schematic diagram form, an array of prior art SRAM cells 10–13. SRAM cells 10–13 are conventional four transistor SRAM cells having polysilicon load elements and N-channel MOS transistors. SRAM cell 10 includes load elements 15 and 16, pull-down transistors 17 and 18, and coupling transistors 19 and 20. Each of the other cells 11–13 have load elements and transistors similar to those of cell 10. A gate of each of the coupling transistors of cells 10–13 is connected to a word line labeled "WL". Coupled to a drain/source terminal of each cell is a bit line. For example, cell 10 is coupled to bit line pair $BL_0/BL_0^*$, and cell 11 is coupled to bit line pair $BL_1/BL_1^*$. A bit of data is represented as a logic high voltage on one of storage nodes 101 or 102. The load elements are polysilicon load resistors, and are connected to a power supply voltage terminal labeled "$V_{DD}$" for receiving a positive power supply voltage. A power supply voltage terminal labeled "$V_{SS}$" is at zero volts, or ground potential. A diffusion layer is used to couple SRAM cells 10–13 to the $V_{SS}$ terminal. In an array including SRAM cells 10–13, $V_{SS}$ is provided to the diffusion layer every fourth cell as illustrated by a $V_{SS}$ terminal on either end. $V_{SS}$ is distributed across the array using a metal layer, usually aluminum. The diffusion layer has a relatively large parasitic resistance as compared to metal. As illustrated in FIG. 1, cells 10 and 13 are closer to $V_{SS}$ than cells 11 and 12. Resistor 43 represents the parasitic resistance of the diffusion layer between the sources of transistors 17 and 18 of cell 10. Resistor 44 represents the parasitic resistance of the ground path between the sources of pull-down transistors 23 and 24 of cell 11. Resistor 45 represents the parasitic resistance of the ground path between the sources of pull-down transistors 30 and 31 of cell 12. Resistor 46 represents the parasitic resistance of the ground path between the source of pull-down transistor 38 and $V_{SS}$. The parasitic resistances cause the ground paths of the cells to be imbalanced. That is, all of the sources of the pull-down transistors may not be at ground potential. An imbalance in the ground path may also affect cell stability.

In FIG. 1 the channel width of the coupling transistors is denoted as $W_1$ and the channel length is denoted as $L_1$. The channel width of the pull-down transistors is denoted as $W_2$ and the channel length is denoted as $L_2$. A cell ratio is defined as $$(W_2/L_2)/(W_1/L_1)$$

The cell ratio is used to describe a SRAM cell's stability against the influences of factors such as power supply fluctuations and noise. Normally, the higher the cell ratio, the greater the cell's stability. Generally, channel length $L_2$ is equal to channel length $L_1$, and channel width $W_2$ is about 3 times wider than channel width $W_1$.

To write a data bit into cell 10, word line WL is a logic high voltage, causing the coupling transistors of each of cells 10–13 to be conductive. The contents of cell 10 is over-written by applying a differential voltage to bit line pair $BL_0/BL_0^*$ that is large enough to cause storage nodes 101 and 102 to change logic states. Assume, for example, that a logic zero is to be written into cell 10. Bit line $BL_0$ is a logic high voltage and bit line $BL_0^*$ is a logic low voltage. The logic high voltage of bit line $BL_0$ is provided to the drain of pull-down transistor 18 at node 102, and to the gate of pull-down transistor 17. The logic low voltage of bit line $BL_0^*$ is provided to the drain of pull-down transistor 17 and to the gate of pull-down transistor 18. Pull-down transistor 17 is conductive, causing node 101 to be coupled to $V_{SS}$. Pull-down transistor 18 is substantially non-conductive, causing node 102 to be at a logic high voltage. The logic high at node 102 keeps the gate of pull-down transistor 17 at a logic high voltage, so that cell 10 is intended to be latched in a relatively stable state until over-written with another write cycle.

To read cell 10, word line WL is a logic high voltage to select all of the cells coupled to word line WL. When word line WL becomes a logic high, all of the cells connected to word line WL provide their contents to their respective bit line pairs, however, only the bit line pair that is selected will provide its contents to output circuitry. The bit line pairs are generally precharged and equalized to a predetermined voltage at the beginning of a read cycle. When word line WL is selected, coupling transistors 19 and 20 are conductive. If storage node 101 is a logic high voltage, bit line $BL_0$ is pulled low through transistor 18, and bit line $BL_0^*$ remains at a logic high voltage, causing a logic one to be read. The conductance of pull-down transistor 18 is higher than the conductance of coupling transistor 19, since channel width $W_2$ is wider than channel width $W_1$. This prevents the drain voltage of transistor 18 from rising above the threshold voltage ($V_T$) of transistor 17, thereby preventing transistor 17 from becoming conductive. However, because of the imbalance in the ground path caused by parasitic resistor 43 in cell 10, the gate-to-source voltage ($V_{GS}$) of transistor 18 is lower than the $V_{GS}$ of transistor 17. Non-conductive transistor 17 may become conductive as a result of the precharge on bit line $BL_0$. This may reduce the voltage of the high node, which in this case is node 101, and cause the cell to inadvertently change logic states during a read cycle. This is less of a problem for cells 11 and 12 because there is less imbalance in their ground path through the diffusion layer to $V_{SS}$. The cells that are adjacent to $V_{SS}$, such as cells 10 and 13, are most likely to fail during a read cycle.

One solution to this problem is to provide more metal $V_{SS}$ lines across the SRAM array, since metal has a lower resistance than a diffusion layer, however this solution may significantly increase the size of the memory array.

SUMMARY OF THE INVENTION

Accordingly, there is provided, in one form, an asymmetric static random access memory cell, including first and second load elements, first and second pull-down transistors, and first and second coupling transistors. The first load element has a first terminal connected to a first power supply voltage terminal, and a second terminal. The second load element has a first terminal connected to the first power supply voltage terminal, and a second terminal. The first pull-down transistor has a first current electrode coupled to the second terminal of the first load element, a second current electrode coupled to a second power supply voltage terminal, and a control electrode. The second pull-down transistor has a first current electrode coupled to the second terminal of the second load element, a second current electrode coupled to the second power supply voltage terminal, and a control electrode. The first coupling transistor has a first current electrode coupled to the first current electrode of the second pull-down transistor, a control electrode, and a second current electrode, the first coupling transistor having a first channel width. The second coupling transistor has a first current electrode coupled to the first current electrode of the first pull-down transistor, a control electrode, and a second current electrode, the second coupling transistor having a second channel width. Wherein the first channel width is less than the second channel width. These and other features and advantages will be more clearly understood from the following detailed description taken in conjunction with the accompanying drawings.

DESCRIPTION OF A PREFERRED EMBODIMENT

Figure 2:
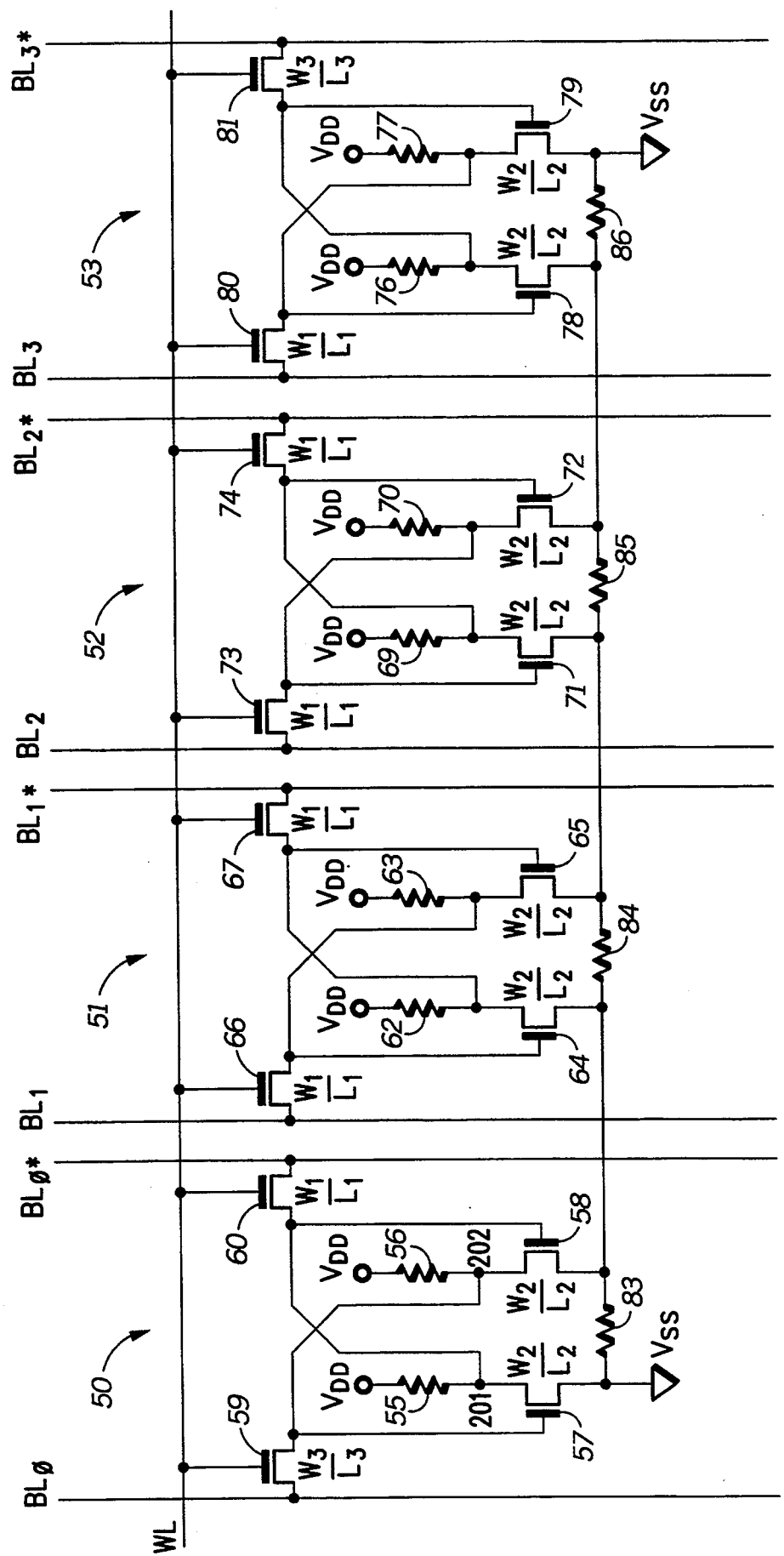
FIG. 2 illustrates in schematic diagram form asymmetric and symmetric SRAM cells in accordance with the present invention.

FIG. 2 illustrates in schematic diagram form asymmetric SRAM cells 50 and 53 and symmetric SRAM cells 51 and 52 in accordance with the present invention. Asymmetric SRAM cell 50 includes load elements 55 and 56, pulldown transistors 57 and 58, and coupling transistors 59 and 60. Symmetric SRAM cell 51 includes load elements 62 and 63, pull-down transistors 64 and 65, and coupling transistors 66 and 67. Symmetric SRAM cell 52 includes load elements 69 and 70, pull-down transistors 71 and 72, and coupling transistors 73 and 74. Asymmetric SRAM cell 53 includes load elements 76 and 77, pull-down transistors 78 and 79, and coupling transistors 80 and 81.

In asymmetric SRAM cell 50, load element 55 has a first terminal connected to power supply voltage terminal $V_{DD}$, and a second terminal connected to a storage node 201. Load element 56 has a first terminal connected to power supply voltage terminal $V_{DD}$, and a second terminal connected to a storage node 202. Pull-down transistor 57 has a drain connected to the second terminal of load element 55 at storage node 201, a gate connected to storage node 202, and a source connected to $V_{SS}$. Pull-down transistor 58 has a drain connected to the second terminal of load element 56 at node 202, a gate connected to storage node 201, and a source connected to $V_{SS}$. In a preferred embodiment, $V_{DD}$ receives a positive power supply voltage equal to approximately 5 volts, and $V_{SS}$ is coupled to ground potential. Cells 51, 52, and 53 are connected in a manner similar to cell 50.

Also illustrated in FIG. 2 are parasitic resistances 83–86 which represent the parasitic resistance of a diffusion layer 94 (illustrated in FIG. 3) between the sources of the pull-down transistors. Diffusion layer 94 forms the sources of cells 50–53 and is the ground path to $V_{SS}$. The source of pull-down transistor 58 is coupled to $V_{SS}$ through parasitic resistance 83. Parasitic resistor 84 represents the parasitic resistance between the sources of pull-down transistors 64 and 65. Parasitic resistor 85 represents the parasitic resistance between the sources of pull-down transistors 71 and 72. Parasitic resistor 86 represents the parasitic resistance between the source of pull-down transistor 78 and $V_{SS}$. Parasitic resistances 83–86 cause imbalances in the ground paths of cells 50–53. Note that there are other parasitic resistances in diffusion layer 94 which are not illustrated. Parasitic resistors 83–86 each represent a parasitic resistance between 500 and 800 ohms.

Coupling transistor 59 of SRAM cell 50 and coupling transistor 81 of SRAM cell 53 have a channel width-to-channel length ratio denoted as $W_3/L_3$, where $W_3$ is the channel width and $L_3$ is the channel length. $W_1/L_1$ denotes the channel width-to-channel length ratio of coupling transistors 60 and 80 of cells 50 and 53, respectively. Coupling transistors 66 and 67 of cell 51 and coupling transistors 73 and 74 of cell 52 have a channel width-to-channel length ratio equal to $W_1/L_1$. The pull-down transistors of all of cells 50–53 have a channel width-to-channel length ratio indicated by $W_2/L_2$. The threshold voltage ($V_T$) of the coupling and pull-down transistors may be adjusted by varying their channel lengths. In the preferred embodiment, channel lengths $L_1$, $L_2$, and $L_3$ are equal to about three microns (drawn sizes). In the preferred embodiment, channel width $W_1$ is equal to about 5.5 microns, while channel width $W_3$ is equal to about 5.0 microns (drawn sizes). Channel width $W_2$ of the pull-down transistors is equal to about 14 microns (drawn sizes). The ratio $W_3/L_3$ of coupling transistor 59 is less than the ratio $W_1/L_1$ of coupling transistor 60, resulting in SRAM cell 50 having asymmetric coupling transistors. The resistance of the coupling and the pull-down transistors may be adjusted by varying their respective channel widths. The result of making channel width $W_3$ smaller than channel width $W_1$ is to cause coupling transistors 59 and 81 to have a higher channel resistance than coupling transistors 60 and 80. When word line WL is a logic high and coupling transistor 59 is conductive, the voltage drop across coupling transistor 59 is larger than the voltage drop across coupling transistor 60. This prevents the gate-source voltage of pull-down transistor 57 from being large enough during a read cycle to cause pull-down transistor 57 to be conductive, thus reducing the chance for cell 50 to fail during a read cycle.

During a read cycle, word line WL is asserted as a logic high voltage by a row decoder (not shown). The logic high voltage may be equal to the power supply voltage provided to $V_{DD}$, or in this case, about 5.0 volts. Coupling transistors 59, 60, 66, 67, 73, 74, 80, and 81 are conductive, thus coupling memory cells 50, 51, 52, and 53 to their respective bit line pairs. The bit line pairs are coupled to a column decoder (not shown). Only the bit line pair that is selected by the column decoder provides its contents to output circuitry (not shown). Prior to a read cycle, the bit line pairs are precharged and equalized to a predetermined voltage, for example, 3.0 volts. The storage node that is at a logic low voltage will pull the bit line to which it is connected to a relatively low voltage with respect to the other bit line of the bit line pair. The differential voltage of the bit line pair is provided to a sense amplifier (not shown) which senses and amplifies the differential voltage and provides a corresponding differential signal to data output circuits (not shown). The logic low bit line needs to be only slightly discharged in order to generate a differential signal large enough to drive the sense amplifier.

Figure 1:
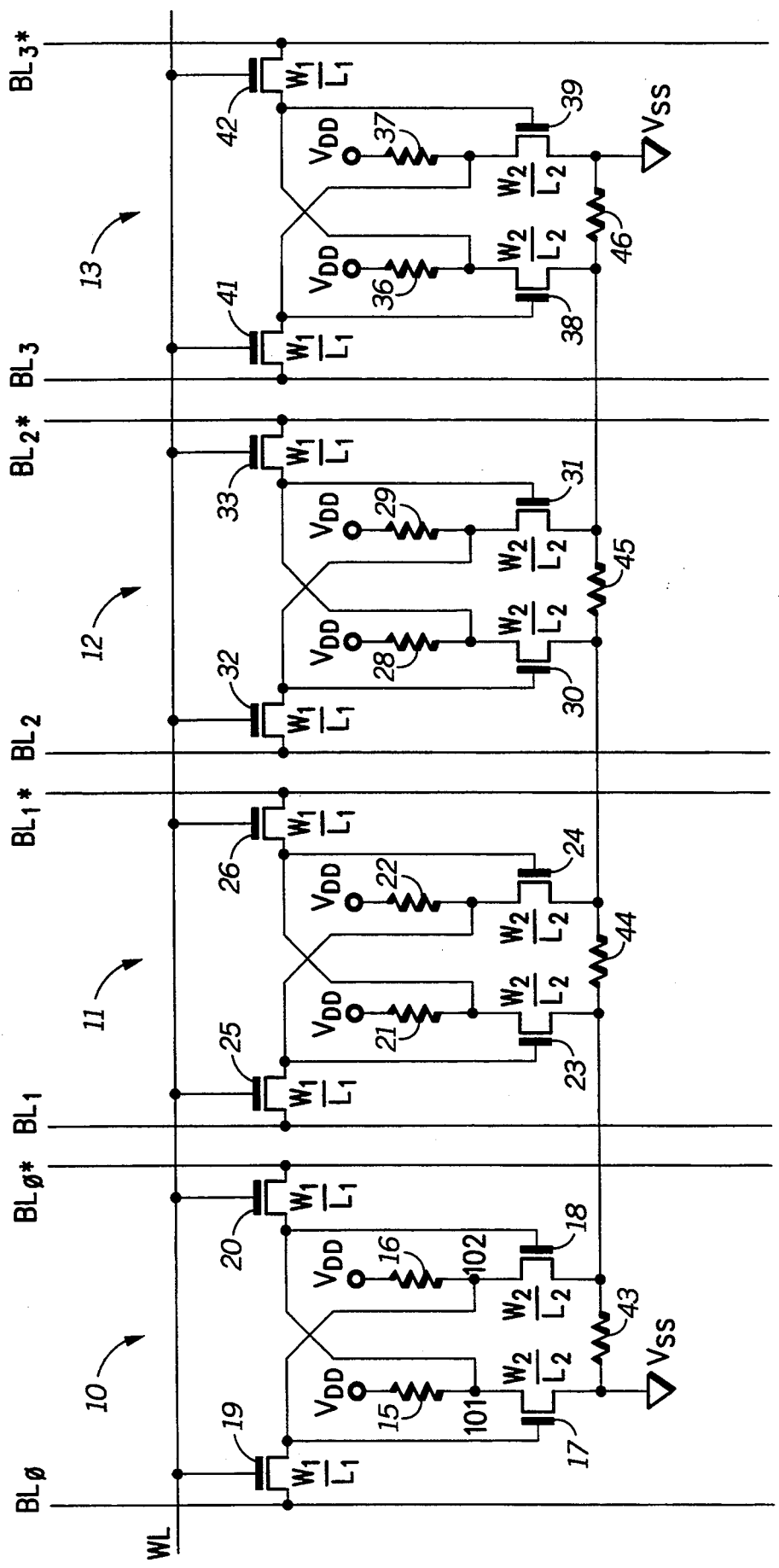
FIG. 1 illustrates in schematic diagram form SRAM cells in accordance with the prior art.

As an example, assume that SRAM cell 50 is to be accessed during a read cycle. Word line WL is asserted as a logic high voltage causing coupling transistors 59 and 60 to be conductive, thus coupling bit line $BL_0$ to storage node 202 and bit line $BL_0^*$ to storage note 201. As discussed above, bit line pair $BL_0/BL_0^*$ is precharged and equalized to a predetermined voltage (about 3.0 volts). If storage node 201 is storing a logic high voltage and storage node 202 is storing a logic low voltage, then pull-down transistor 58 is conductive and pull-down transistor 57 is substantially non-conductive. Since channel width $W_3$ is less than that shown for coupling transistor 19 in prior art FIG. 1, the channel conductance of coupling transistor 59 is smaller, preventing the precharge voltage on bit line $BL_0$ from reaching a level at the gate of pull-down transistor 57 that may cause pull-down transistor 57 to become conductive, thus off-setting the effect of parasitic resistance 83. Since pull-down transistor 58 is conductive, the voltage on $BL_0$ is reduced through pull-down transistor 58. The differential voltage on bit line pair $BL_0/BL_0^*$ is provided to a sense amplifier as discussed above.

Figure 3:
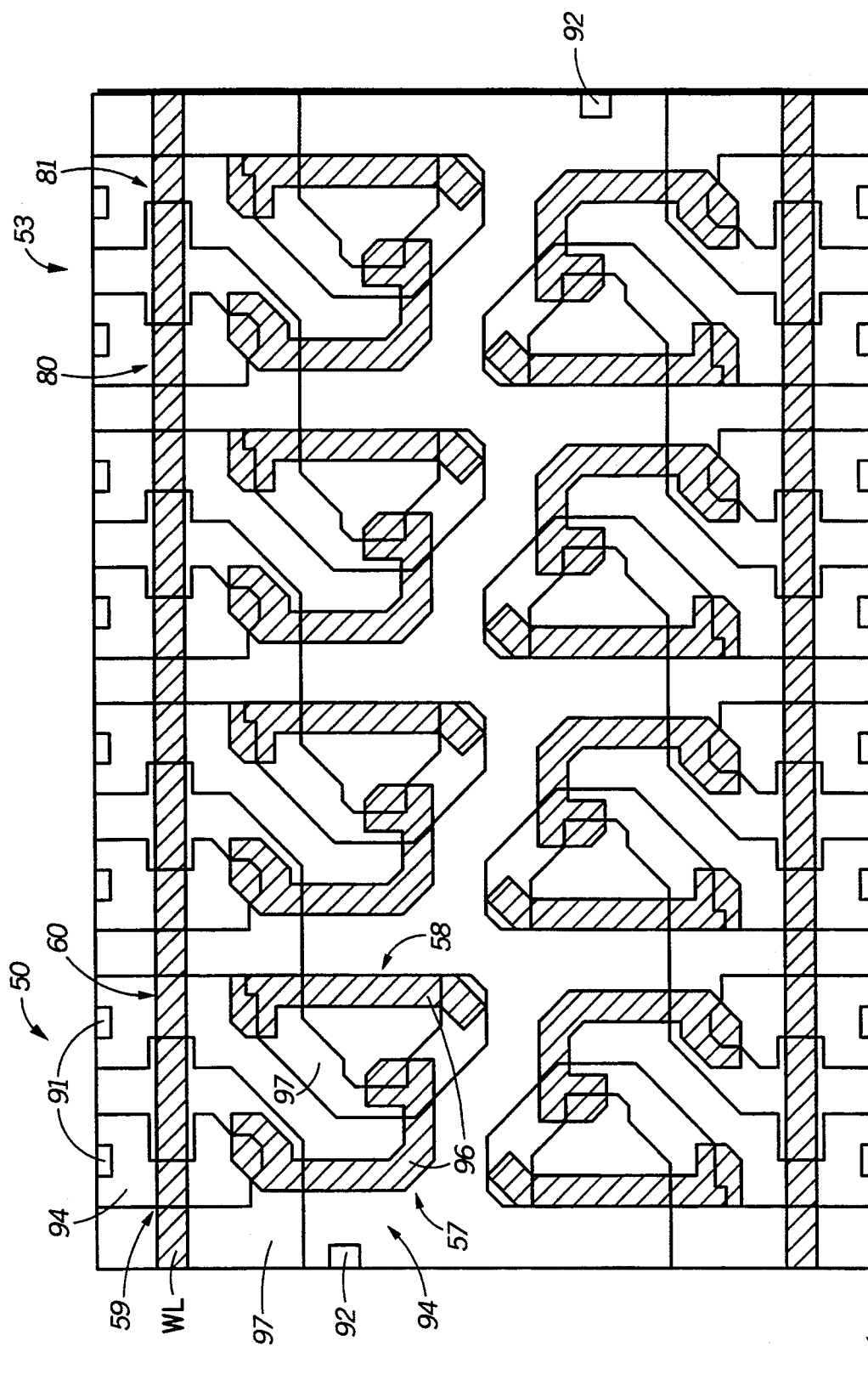
FIG. 3 illustrates in layout diagram form a diffusion layer, a first polysilicon layer, and metal contacts an array of SRAM cells in accordance with the present invention.

FIG. 3 illustrates in layout diagram form a diffusion layer, a first polysilicon layer, and metal contacts of first portion 90 of eight SRAM cells 130 (FIG. 5) in accordance with the present invention. SRAM array 130 includes asymmetric SRAM cells 50 and 53, and symmetric SRAM cells 51 and 52 of FIG. 2. SRAM array 130 resides in a p-well on a silicon substrate, and a double-level polysilicon process is used. A metal layer is used to "strap" $V_{SS}$ to diffusion layer 94 every fourth cell. The first level of polysilicon is used for the gates of the pull-down transistors and for the word lines. Bit lines are formed in the metal layer, however they are not shown for clarity. Diffusion layer 94 is used to form drain and source regions of all of the transistors. Silicon dioxide insulation layer 97 covers the areas that are not covered by diffusion layer 94. Metal contacts 91 connect the drains of the coupling transistors to metal bit lines. Metal contacts 92 connect metal $V_{SS}$ lines to diffusion layer 94. A $V_{SS}$ metal contact 92 is provided every fourth cell. A first polysilicon layer provides word line WL and polysilicon gates 96 for pull-down transistors 57 and 58. Where polysilicon gates 96 cross over drain and source region 94 pull-down transistors 57 and 58 are formed. Where word line WL crosses above diffusion layer 94, coupling transistors 59 and 60 are formed. Note that the width of diffusion layer 94 which forms the gate of coupling transistor 59 is narrower than the width of diffusion layer 94 for the gate of coupling transistor 60. (The channel widths of transistors 59 and 60 are not drawn to scale.) Likewise, the gate width of coupling transistor 81 for cell 53 is narrower than the gate width of coupling transistor 80. The bottom half of array 130 includes four SRAM cells and is essentially a mirror image of the top half of array 130.

Figure 4:
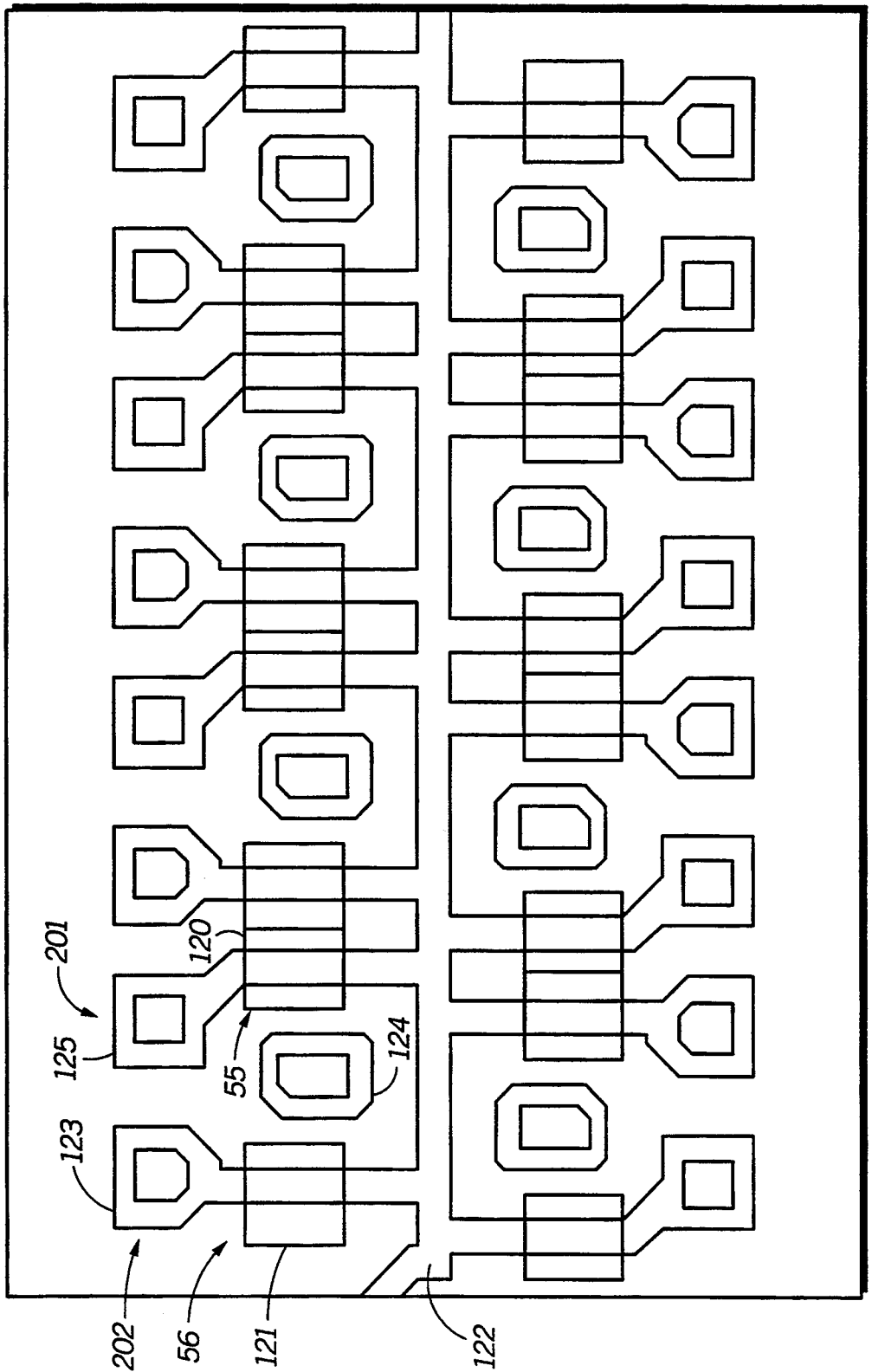
FIG. 4 illustrates in layout diagram form a second polysilicon layer and ion-implanted areas of the array of SRAM cells of FIG. 3.

FIG. 4 illustrates in layout diagram form a second portion 120 illustrating a second polysilicon layer and ion-implanted areas of SRAM array 130. Reference numbers for cell 50 are included for the purposes of illustration. The second level of polysilicon is used for a power supply $V_{DD}$ line and for polysilicon load resistors 55 and 56 of cell 50. Shared contacts 123, 124, and 125 are used to couple the first polysilicon layer and the second polysilicon layer to diffusion layer 94 to form storage nodes 201 and 202 and additional circuit connections. The second polysilicon layer of areas 120 and 121 are blocked from being ion-implanted to form polysilicon load resistors 55 and 56.

Figure 5:
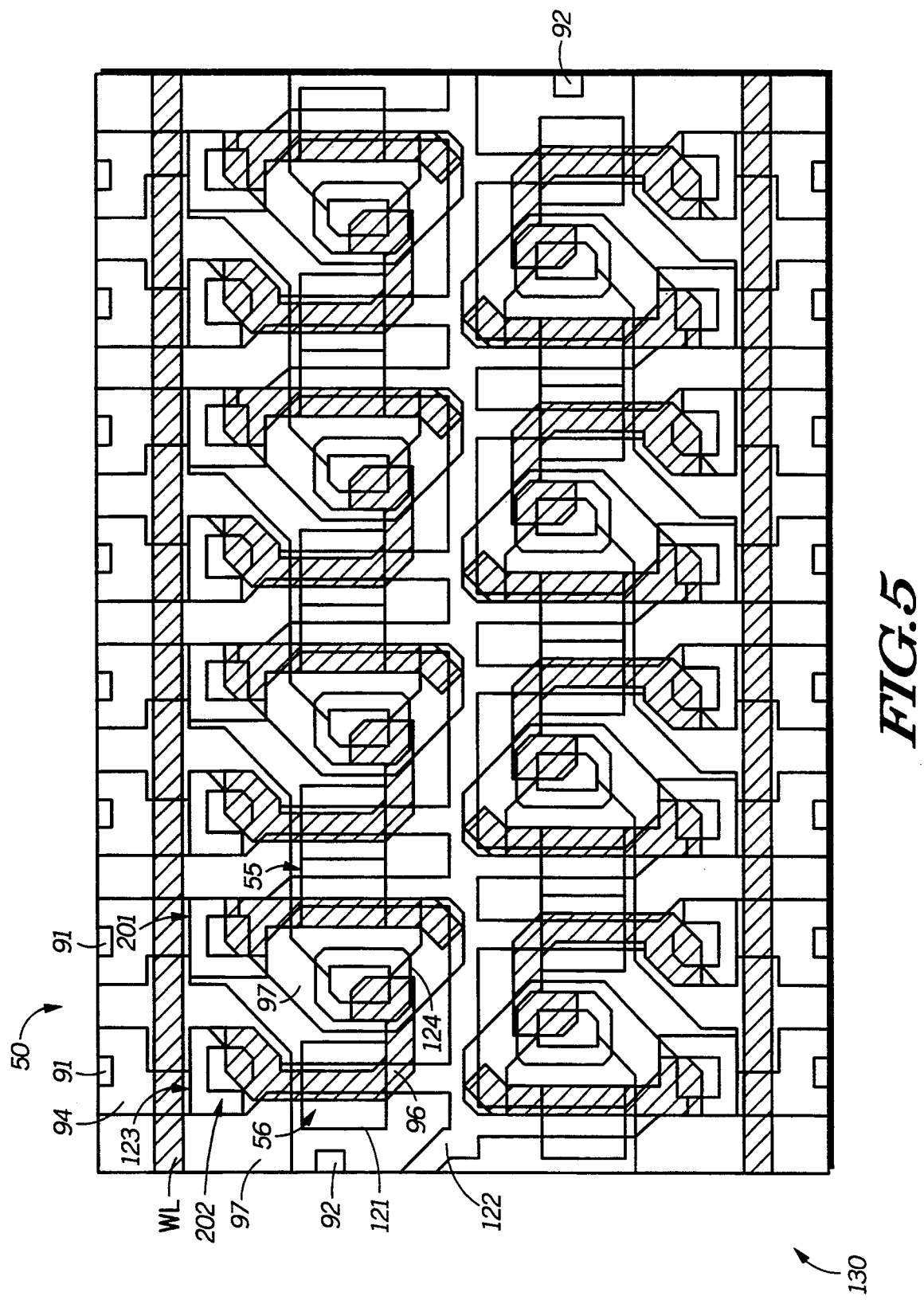
FIG. 5 illustrates in layout diagram form a multi-layer composite of FIG. 3 and FIG. 4.

FIG. 5 illustrates in SRAM array 130 in layout diagram form as a multi-layer composite of the layout diagrams of FIG. 3 and FIG. 4. The polysilicon resistors are shown formed over the pull-down transistors in a "stacked" arrangement in order to decrease the surface area required by each cell.

An array with asymmetric cells adjacent to the $V_{SS}$ lines and symmetric cells in the center of the array compensates for the imbalanced ground path caused by parasitic resistance of the diffusion layer, thus improving cell stability during a read cycle. The improved cell stability of the asymmetric cells near the $V_{SS}$ lines reduces the possibility of overwriting an asymmetric cell during a read cycle, without degrading performance of the array or increasing cell area.

While the invention has been described in the context of a preferred embodiment, it will be apparent to those skilled in the art that the present invention may be modified in numerous ways and may assume many embodiments other than that specifically set out and described above. For example, the invention can be implemented using P-channel metal-oxide semiconductor (PMOS) transistors, or in semiconductors using gallium arsenide. Accordingly, it is intended by the appended claims to cover all modifications of the invention which fall within the true spirit and scope of the invention.

What is claimed is:

1. An asymmetric static random access memory cell, comprising:

a first load element having a first terminal connected to a first power supply voltage terminal, and a second terminal;

a second load element having a first terminal connected to the first power supply voltage terminal, and a second terminal;

a first pull-down transistor having a first current electrode coupled to the second terminal of the first load element, a second current electrode coupled to a second power supply voltage terminal, and a control electrode;

a second pull-down transistor having a first current electrode coupled to the second terminal of the second load element, a second current electrode coupled to the second power supply voltage terminal, and a control electrode;

a first coupling transistor having a first current electrode coupled to the first current electrode of the second pull-down transistor, a control electrode, and a second current electrode, the first coupling transistor having a first channel width; and a second coupling transistor having a first current electrode coupled to the first current electrode of the first pull-down transistor, a control electrode, and a second current electrode, the second coupling transistor having a second channel width;

wherein the first channel width is less than the second channel width.

2. The asymmetric static random access memory cell of claim 1, wherein the first and second load elements are characterized as being polysilicon load resistors.

3. The asymmetric static random access memory cell of claim 1, wherein the first and second pull-down transistors and the first and second coupling transistors are N-channel MOS transistors.

4. The asymmetric static random access memory cell of claim 1, wherein the first coupling transistor has a first channel length and the second coupling transistor has a second channel length, the first and second channel lengths being substantially equal.

5. The asymmetric static random access memory cell of claim 1, wherein the gates of the first and second coupling transistors and the gates of the first and second pull-down transistors are formed in a first polysilicon layer.

6. The asymmetric static random access memory cell of claim 5, wherein the first and second load elements are formed in a second polysilicon layer.

7. An asymmetric static random access memory cell, comprising:

a first load element having a first terminal connected to a first power supply voltage terminal, and a second terminal;

a second load element having a first terminal connected to the first power supply voltage terminal, and a second terminal;

a first pull-down transistor having a first current electrode coupled to the second terminal of the first load element, a second current electrode coupled to a second power supply voltage terminal, and a control electrode;

a second pull-down transistor having a first current electrode coupled to the second terminal of the second load element, a second current electrode coupled to the second power supply voltage terminal, and a control electrode;

a first coupling transistor having a first current electrode coupled to the first current electrode of the second pull-down transistor, a control electrode, and a second current electrode, the first coupling transistor having a first channel width-to-channel length ratio; and a second coupling transistor having a first current electrode coupled to the first current electrode of the first pull-down transistor, a control electrode, and a second current electrode, the second coupling transistor having a second channel width-to-channel length ratio;

wherein the first channel width-to-channel length ratio being less than the second channel width-to-channel length ratio.

8. The asymmetric static random access memory cell of claim 7, wherein the first and second load elements are characterized as being ion-implanted polysilicon load resistors.

9. The asymmetric static random access memory cell of claim 7, wherein the first and second pull-down transistors and the first and second coupling transistors are N-channel MOS transistors.

10. The asymmetric static random access memory cell of claim 7, wherein the gates of the first and second coupling transistors and the gates of the first and second pull-down transistors are formed in a first polysilicon layer.

11. The asymmetric static random access memory cell of claim 10, wherein the first and second load elements are formed in a second polysilicon layer.

12. A static random access memory array, comprising:

a plurality of words lines;

a plurality of bit line pairs arranged to intersect the plurality of word lines;

a power supply voltage terminal;

a first plurality of static random access memory cells coupled to the power supply voltage terminal, a memory cell of the first plurality of static random access memory cells having a first storage node coupled to a first bit line of a first bit line pair by a first coupling transistor, and a second storage node coupled to a second bit line of the first bit line pair by a second coupling transistor, a channel width of the first coupling transistor being different than a channel width of the second coupling transistor; and a second plurality of static random access memory cells coupled to the power supply voltage terminal, a memory cell of the second plurality of static random access memory cells having a first storage node coupled to a first bit line of a second bit line pair by a third coupling transistor, and second storage node coupled to a second bit line of the second bit line pair by a fourth coupling transistor, a channel width of the third coupling transistor being substantially equal to a channel width of the fourth coupling transistor 13. The static random access memory array of claim 12, wherein the plurality of word lines are polysilicon word lines.

14. The static random access memory array of claim 12, wherein the power supply voltage terminal is coupled to ground potential.

15. The static random access memory array of claim 12, wherein both the first plurality of static random access memory cells and the second plurality of static random access memory cells are four transistor static random access memory cells having polysilicon load resistors and N-channel MOS transistors.

16. The static random access memory array of claim 12, wherein the memory cell of the first plurality of static random access memory cells comprises:

a first load element having a first terminal and a second terminal;

a second load element having a first terminal and a second terminal;

a first pull-down transistor having a first current electrode coupled to the second terminal of the first load element, a second current electrode coupled to the power supply voltage terminal, and a control electrode;

a second pull-down transistor having a first current electrode coupled to the second terminal of the second load element, a second current electrode coupled to the power supply voltage terminal, and a control electrode;

the first coupling transistor having a first current electrode coupled to the first current electrode of the second pull-down transistor, a control electrode coupled to one of the word lines, and a second current electrode coupled to the first bit line of the first bit line pair, the first coupling transistor having a first channel width; and the second coupling transistor having a first current electrode coupled to the first current electrode of the first pull-down transistor, a control electrode coupled to the word line, and a second current electrode coupled to the second bit line of the second bit line pair, the second coupling transistor having a second channel width, the first channel width being less than the second channel width.

* * * * *